United States Patent [19]

Ma

[11] Patent Number: 5,642,259
[45] Date of Patent: Jun. 24, 1997

[54] ARRANGEMENT FOR CONNECTING AN EXPANSION CARD TO A CONNECTOR SOCKET IN A PERSONAL COMPUTER

[76] Inventor: Hsi-Kuang Ma, 4F, No. 48, Sec. 2, Chung Cherng Rd., Taipei, Taiwan

[21] Appl. No.: 594,465

[22] Filed: Jan. 31, 1996

[51] Int. Cl.$^6$ ................................ G06F 1/16; H05K 7/10
[52] U.S. Cl. ................................ 361/686; 361/684
[58] Field of Search ............ 364/708.1; 439/928, 439/928.1; 361/684, 686, 737

[56] References Cited

U.S. PATENT DOCUMENTS

| | | | |
|---|---|---|---|
| 5,036,430 | 7/1991 | Hiils | 361/684 |
| 5,337,220 | 8/1994 | Granitz | 361/684 X |
| 5,400,216 | 3/1995 | Tsai | 361/684 |
| 5,423,697 | 6/1995 | MacGregor | 439/928 |
| 5,440,449 | 8/1995 | Scheer | 361/686 |
| 5,445,525 | 8/1995 | Broadbent et al. | 361/686 X |
| 5,473,505 | 12/1995 | Kessoku et al. | 361/684 |
| 5,505,633 | 4/1996 | Broadbent | 361/686 X |
| 5,509,811 | 4/1996 | Homic | 439/928.1 X |
| 5,519,571 | 5/1996 | Shieh | 361/686 X |

*Primary Examiner*—Michael W. Phillips
*Attorney, Agent, or Firm*—Bacon & Thomas

[57] ABSTRACT

An improved expansion device for personal computers includes a frame mounted on a substrate board of the computer with its front opening located in an expansion slot in one side of the computer, the frame having multiple contact pins at an inner rear side thereof for connection with the motherboard; a plurality of contacts disposed on the substrate board within the frame and connected respectively via lines to a module jack; the module jack provided near an edge of the computer; and an expansion card having a plurality of contacts at a bottom side thereof. The expansion card is inserted into the frame via the expansion slot such that the contacts of the expansion card contact the contacts on the substrate board within the frame. The module jack is provided for receiving a module plug.

3 Claims, 4 Drawing Sheets

ARRANGEMENT FOR CONNECTING AN EXPANSION CARD TO A CONNECTOR SOCKET IN A PERSONAL COMPUTER

BACKGROUND OF THE INVENTION (a) Field of the Invention

The present invention relates generally to an expansion device, and more particularly to an expansion device for personal computers to provide easy and convenient connection.

(b) Description of the Prior Art

Expansion cards have become indispensable components of computers, especially portable computers, since they help expand the functions and capacity of computers.

There are different types of expansion cards of different functions. In recent years, they have been standardized globally, and there are the so-called PCMCIA (Personal Computer Memory Card International Association) cards, such as the widely used memory cards, fax/modem cards, LAN cards, etc.

FIGS. 1 and 2 illustrates a conventional expansion device used in a notebook computer. The notebook computer has a slot 10 formed in a lateral side thereof. A PCMCIA card 40, such as a fax/modem card, is provided with a plurality of pin holes at an outer side thereof for receiving a plurality of contact pins of a plug 30 which is connected to a jack 20. The PCMCIA card 40 is inserted into an expansion frame 50 pre-disposed inside the notebook computer. An RJ-11 plug 60 commonly used in telephone sets is plugged into the jack 20 to accomplish the connection. Such an arrangement is evidently complicated and troublesome.

A major reason why such a complicated arrangement is commonly adopted in the art is due to the fact that the height of the RJ11 plug 60 is greater than that of the expansion card, i.e., the PCMCIA card 40, so that the RJ11 plug 60 cannot be directly connected thereto and has to be indirectly connected thereto via the jack 20 of an adapter. Such an arrangement may easily result in poor connection. Besides, carrying a separate adapter is very inconvenient.

SUMMARY OF THE INVENTION

Accordingly, a primary object of the present invention is to provide an improved expansion device for personal computers, in which use of a separate adapter may be eliminated.

In order to achieve the above-mentioned object, the improved expansion device for personal computers according to the present invention comprises a frame mounted on a substrate board of the computer with its front opening located in an expansion slot formed in one side of the computer, the frame having multiple contact pins at an inner rear side thereof for connection with the motherboard; a plurality of contacts disposed on the substrate board within the frame and connected respectively via lines to a module jack; the module jack provided near an edge of the computer; and an expansion card having a plurality of contacts at a bottom side thereof. The expansion card is inserted into the frame via the expansion slot such that the contacts of the expansion card contact the contacts on the substrate board within the frame. The module jack is provided for receiving a module plug.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
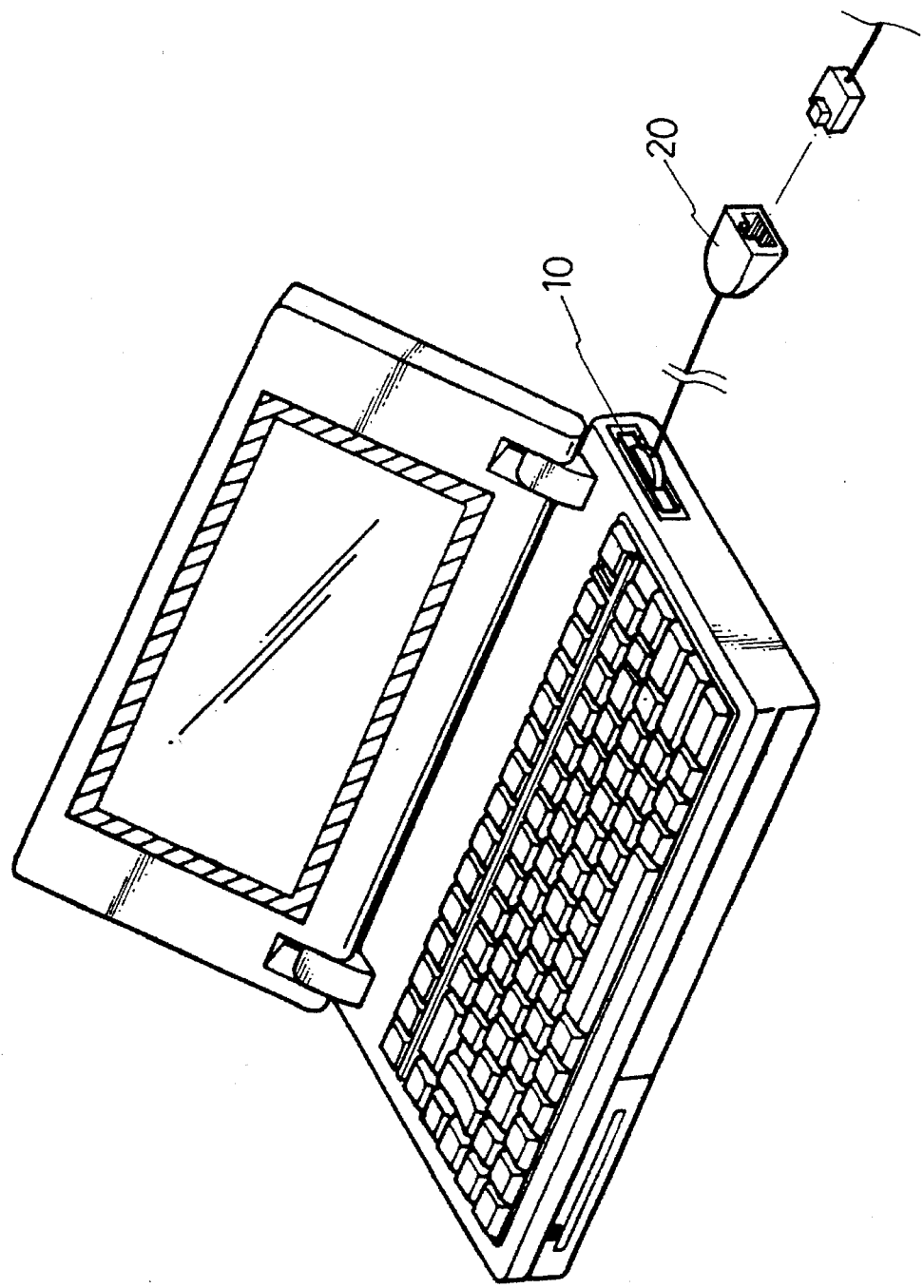
FIG. 1 is a schematic elevational view of a conventional expansion device.
Figure 2:
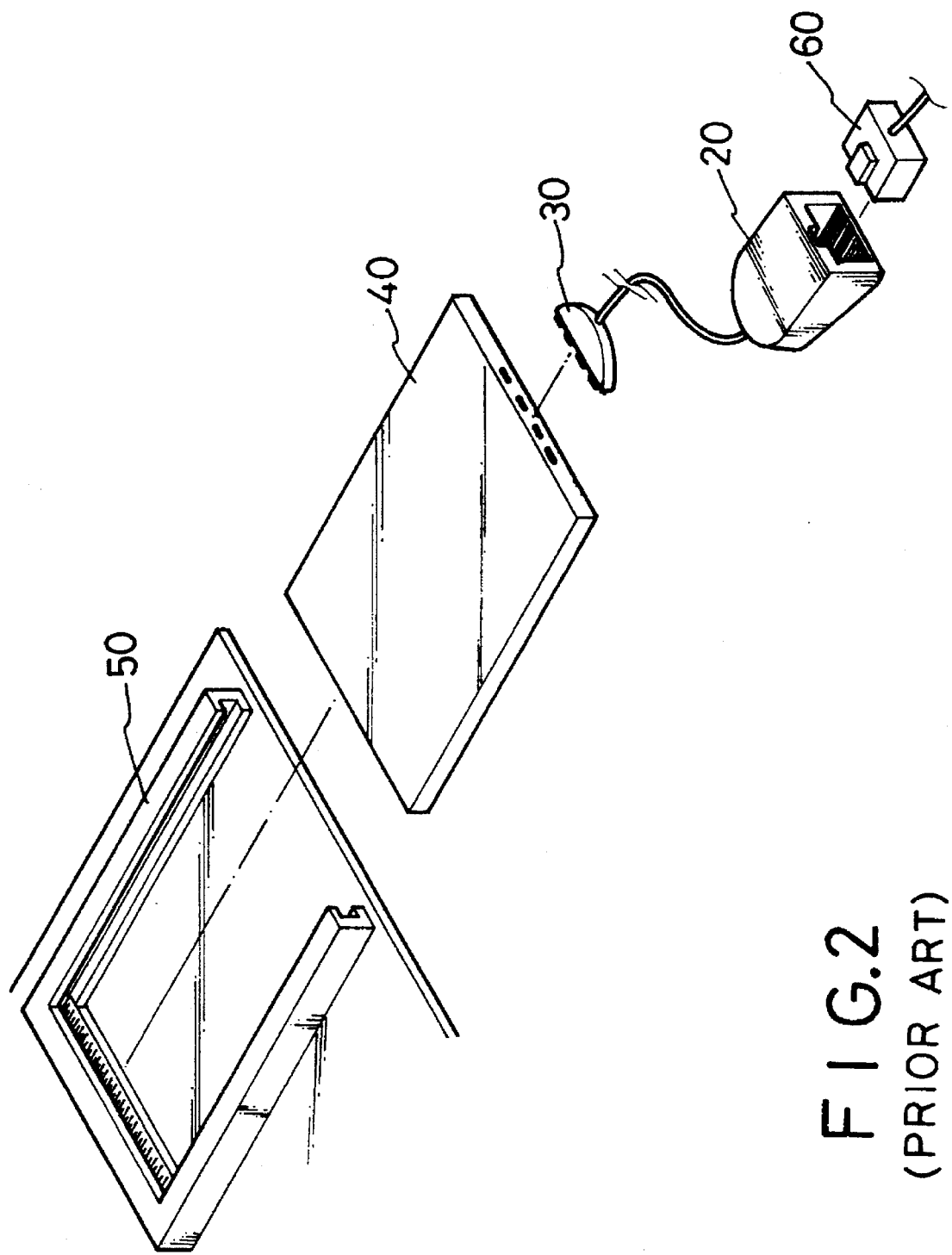
FIG. 2 is a schematic view of the conventional expansion device.
Figure 3:
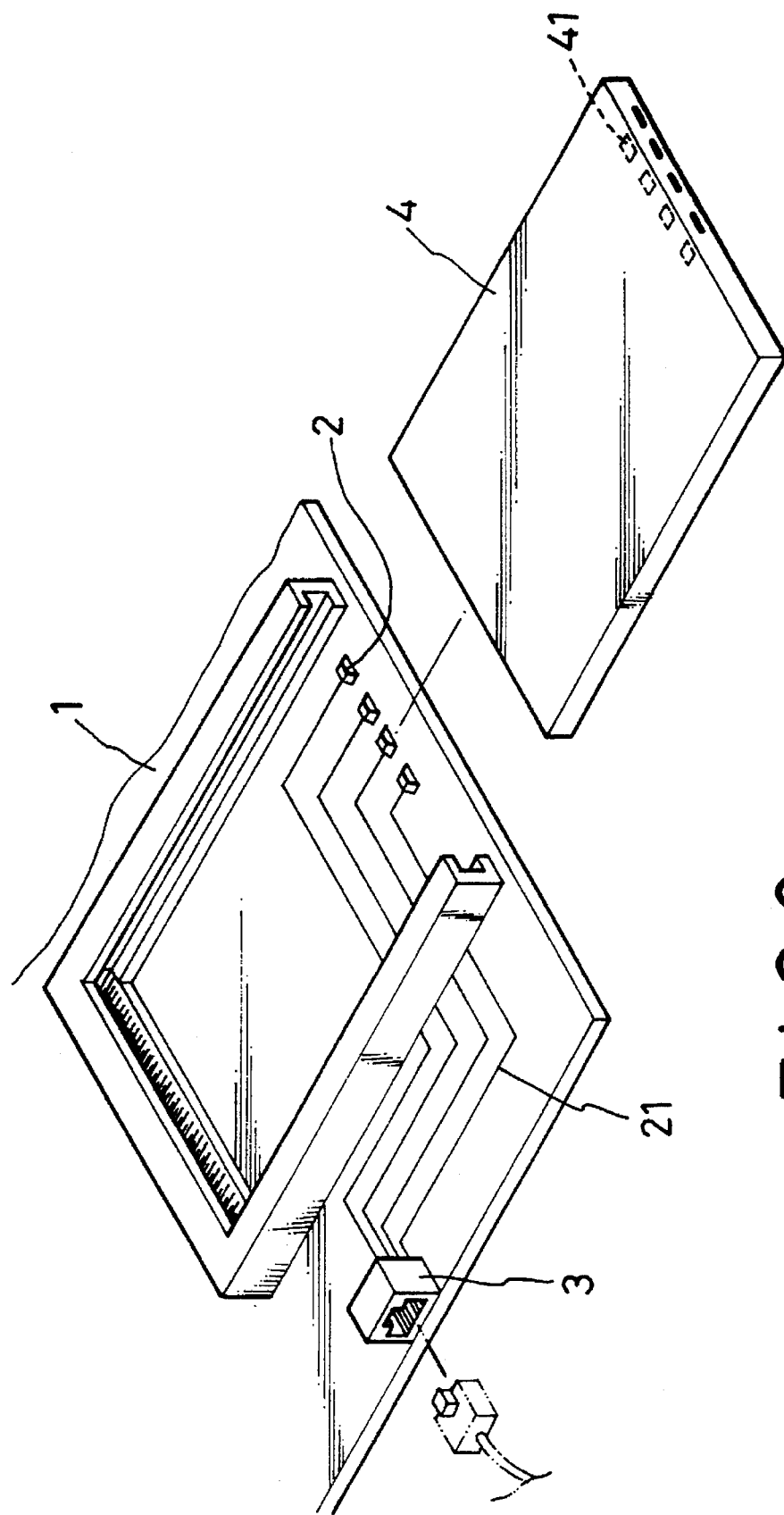
FIG. 3 is an exploded, elevational view of a preferred embodiment of the improved expansion device according to the present invention.

With reference to FIG. 3, a preferred embodiment of the expansion device according to the present invention basically comprises a frame 1, a plurality of contacts 2, a module jack 3 and an expansion card 4.

The frame 1 is disposed on a substrate board of a notebook computer with its front opening oriented towards the outside for insertion of the expansion card 4 therein. At an inner rear side of the frame 1, there is provided a plurality of contact pins connected to the motherboard. As such a technique is well known in the art, it will not be discussed in detail herein.

The contacts 2 are disposed on the substrate board within the frame 1 for contacting a plurality of contacts 41 provided on a bottom side of the expansion card 4 to make the connection. Besides, the contacts 2 are respectively connected to the module jack 3 via a plurality of connecting lines 21.

The module jack 3 is fixedly provided near an edge of the substrate board for receiving a module plug, such as an RJ-11 plug used in this preferred embodiment. In actual practice, the module jack 3 may be modified to match the varying heights of notebook computers.

The expansion card 4 is a known PCMCIA card of a specific function, such as a memory card, a fax/modem card, a LAN card, and so forth. Like the prior art, the expansion card 4 according to the present invention is provided with a plurality of connecting pins (not shown) at a rear side thereof for matching those at the inner rear side of the frame 1. A salient feature of the expansion card 4 of the invention resides in the arrangement of the contacts 41 at the bottom side thereof for matching the contacts 2 on the substrate board. The contacts 41 are connected to a plurality of pin holes for connection purposes.

Figure 4:
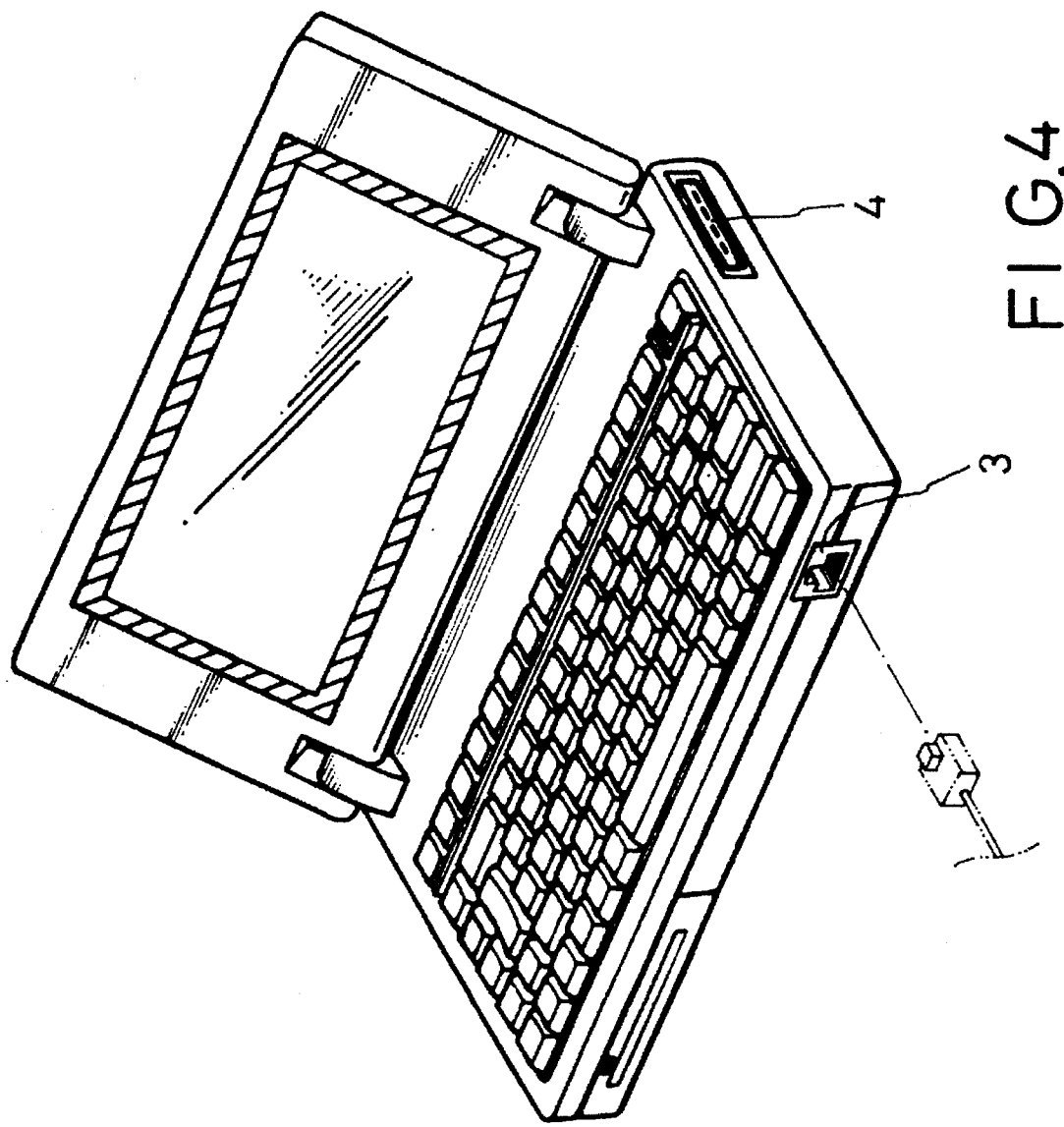
FIG. 4 is a schematic elevational view of a notebook computer using the present invention.

In actual practice, with reference to FIG. 4, after the expansion card 4 is inserted into the frame 1 via a slot at a lateral side of the notebook computer, the connecting pins of the expansion card 4 and the pins of the frame 1 will make the connection, while the contacts 41 will contact the contacts 2 which are linked by connecting lines 21 to the module jack 3.

In another preferred embodiment, the module jack 3 or the contacts 41 on the bottom side of the expansion card 4 may be configured to be spring strips.

Therefore, since the height of the notebook computer is considerably greater than that of the module jack 3, there is no need for an adapter used in the prior art. Since the module jack 3 is fixedly disposed on the computer, the disadvantage of poor contact in the prior art is eliminated. Besides, there is no need to carry a separate adapter for the notebook computer.

Although the present invention has been illustrated and described with reference to the preferred embodiment thereof, it should be understood that it is in no way limited to the details of such embodiment but is capable of numerous modifications within the scope of the appended claims.

What is claimed is:

1. An improved expansion arrangement for personal computers, comprising:

an expansion card;

a frame disposed on a substrate board of a personal computer for receiving said expansion card, said frame having a front opening located at an expansion slot formed at a lateral side of a computer, said frame being provided with a plurality of pins at an inner rear side thereof for connection between said expansion card and a motherboard;

a plurality of contacts disposed on said substrate board within said frame;

a connecting socket mounted on said substrate board, said contacts being respective linked by a plurality of connecting lines to said connecting socket;

said connecting socket being disposed near an edge of the computer and arranged to receive a plug;

and said expansion card having a plurality of contacts on a bottom side thereof arranged such that when the expansion card is inserted into said frame, said contacts on the bottom side of said expansion card are in contact with said contacts on said substrate board.

2. An improved expansion arrangement as claimed in claim 1, wherein said expansion frame and said connecting socket are disposed on a same side of the computer.

3. An improved expansion arrangement as claimed in claim 1, wherein said connecting socket receives an RJ-11 plug.

* * * * *